(12) United States Patent
Bonachea et al.

(10) Patent No.: US 12,199,468 B2
(45) Date of Patent: Jan. 14, 2025

(54) MOBILE MEMORY MODULE FOR ELECTRICAL TRANSFER SWITCH

(71) Applicant: ASCO Power Technologies, L.P., Florham Park, NJ (US)

(72) Inventors: Victor Bonachea, Elmwood Park, NJ (US); John E. Hayes, Hardwick, NJ (US); Mario Ibrahim, Summit, NJ (US)

(73) Assignee: ASCO Power Technologies, L.P., Florham Park, NJ (US)

( * ) Notice: Subject to any disclaimer, the term of this patent is extended or adjusted under 35 U.S.C. 154(b) by 309 days.

(21) Appl. No.: 17/733,568

(22) Filed: Apr. 29, 2022

(65) Prior Publication Data

US 2023/0352971 A1 Nov. 2, 2023

(51) Int. Cl.
| | |
|---|---|
| *H05K 7/10* | (2006.01) |
| *H02J 9/06* | (2006.01) |
| *H05K 5/02* | (2006.01) |
| *H05K 7/14* | (2006.01) |

(52) U.S. Cl.
CPC ............ *H02J 9/068* (2020.01); *H05K 5/0278* (2013.01); *H05K 7/10* (2013.01); *H05K 7/1427* (2013.01)

(58) Field of Classification Search
CPC ...... H05K 5/0278; H05K 7/10; H05K 7/1427; H02J 9/068
See application file for complete search history.

(56) References Cited

U.S. PATENT DOCUMENTS

| | | | |
|---|---|---|---|
| 5,973,919 A * | 10/1999 | Larabell | G11B 33/128 |
| 2005/0166026 A1* | 7/2005 | Ware | G11C 7/10 |
| | | | 711/167 |
| 2006/0114661 A1 | 6/2006 | Haba | |
| 2006/0277422 A1* | 12/2006 | Berke | G11C 5/141 |
| | | | 713/300 |
| 2009/0277683 A1 | 11/2009 | Winterhalter et al. | |
| 2012/0048867 A1 | 3/2012 | Ogawa | |
| 2012/0140402 A1* | 6/2012 | Mizumura | H05K 7/20836 |
| | | | 361/679.33 |
| 2014/0148958 A1 | 5/2014 | Evans et al. | |
| 2016/0048277 A1 | 2/2016 | Scott et al. | |

(Continued)

OTHER PUBLICATIONS

International Search Report and Written Opinion for PCT Application No. PCT/US23/14065; Dated: Jul. 18, 2023.

*Primary Examiner* — Hoa C Nguyen
(74) *Attorney, Agent, or Firm* — Locke Lord LLP

(57) ABSTRACT

Systems and methods for providing a mobile memory module in an automatic transfer switch (ATS) allow the memory module to be easily removed from a controller of the ATS. The mobile memory module is a discrete, nonvolatile memory module that stores operational settings for the ATS and can be mounted and removed via a removable fastener. When thus mounted, the mobile memory module is connected to a signal path that allows data communication with a microprocessor on the controller. The microprocessor can retrieve operational settings from the mobile memory module as needed and store updated or new operational settings on the mobile memory module as required. In some embodiments, the mobile memory module has a protective outer housing that is hardened to withstand catastrophic transfer switch failure while still retaining all operational settings stored on the module.

12 Claims, 7 Drawing Sheets

(56) References Cited

U.S. PATENT DOCUMENTS

| | | | |
|---|---|---|---|
| 2017/0353150 A1* | 12/2017 | Alon | H02G 3/16 |
| 2020/0097059 A1* | 3/2020 | Ou Yang | G06F 1/3206 |
| 2020/0212959 A1* | 7/2020 | Eriksen | H02H 1/0092 |
| 2020/0260617 A1* | 8/2020 | Madanipour | H05K 7/20736 |

* cited by examiner

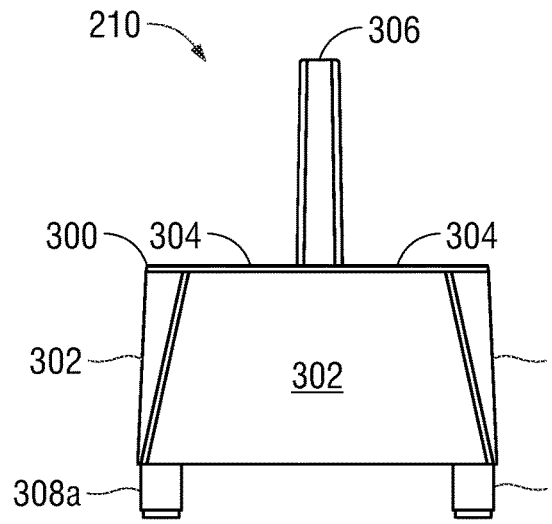
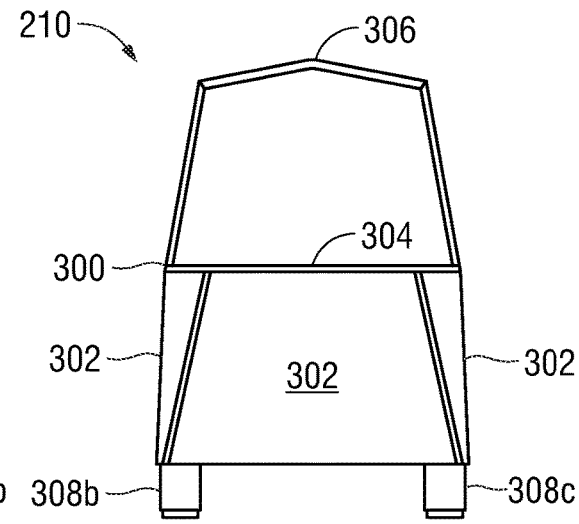
FIG. 3A  FIG. 3B
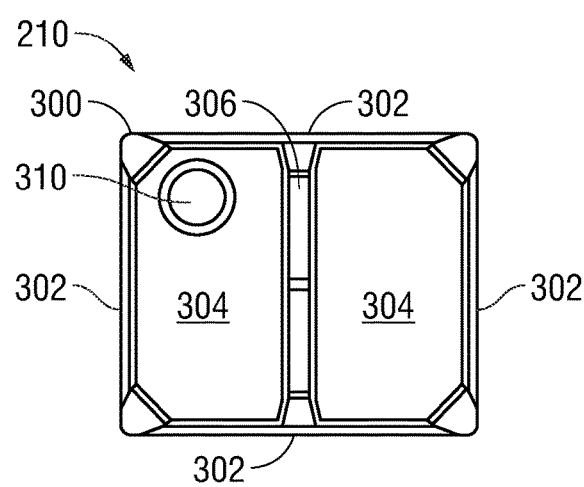
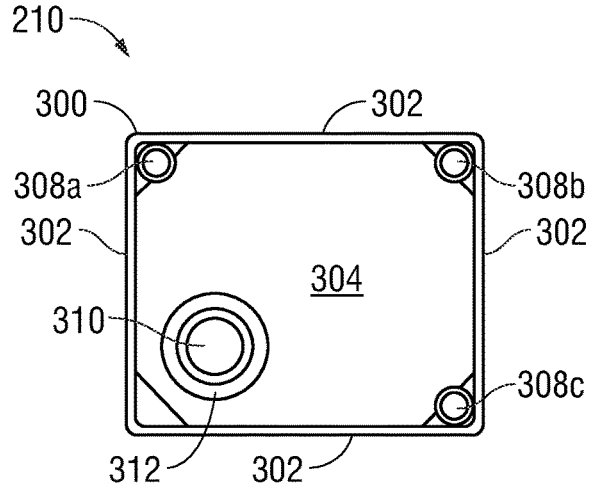
FIG. 3C  FIG. 3D

MOBILE MEMORY MODULE FOR ELECTRICAL TRANSFER SWITCH

TECHNICAL FIELD

The present disclosure relates generally to electrical transfer switches for power control systems and particularly to systems and methods for a mobile memory module in such electrical transfer switches.

BACKGROUND

A power control system (PCS) typically includes a combination of electrical power control components that operate in conjunction with one another, such as backup generators, transformers, circuit breakers, fuses, distribution panels, transfer switches, and the like. The transfer switch is particularly important for ensuring safe, efficient, and reliable source of power in the event of a sudden loss of main electrical power. When such a power loss event occurs, the transfer switch is used to switch the power source from the main or utility power to a backup power source.

Transfer switches may be manual switches or automatic switches. An automatic transfer switch (ATS) is designed to automatically switch to a backup power source when the utility power source becomes unavailable, and to automatically switch back when the utility power source becomes available again. As such, the ATS needs to be configured with several operational settings to function properly when a power loss event occurs. For example, the ATS needs to be configured with the settings for normal voltage, frequency, and phase angle for the power received from the utility power source. The ATS can then detect when utility power deviates from these operational settings and automatically switch to the backup power source.

In most ATS, the operational settings are stored in a microprocessor on board a controller board or in a separate memory chip mounted (e.g., soldered) on the controller board, or a combination of both. Consequently, when the controller board needs to be replaced, for example, due to a catastrophic failure of the ATS, the previously stored operational settings are lost. A technician typically has to reconfigure a replacement controller board with the appropriate operational settings, which can be a difficult and time-consuming process.

U.S. Pat. No. 8,643,315, entitled "Universal Apparatus and Method for Configurably Controlling a Heating or Cooling System Related to a Universal Controller for HVAC Systems," discloses a system for controlling the operation of an HVAC system. The HVAC system includes a system controller and a memory in which system parameter information relating to the HVAC system is stored. The system controller is configured to store, in the memory, received operational parameters corresponding to at least one system component. The stored parameters may be retrieved for communication to a replacement component controller in the event that the at least one component controller is replaced.

SUMMARY

Embodiments of the present disclosure relate to systems and methods for providing a mobile memory module that stores operational settings for an electrical transfer switch. The mobile memory module is a discrete, nonvolatile memory module that can be removably mounted to a controller of the transfer switch via a removable fastener, such as a locking pin or screw. When mounted to the controller, the mobile memory module is connected to a signal path that allows data communication with a microprocessor on the controller. The microprocessor can retrieve operational settings from the mobile memory module as needed and store updated or new operational settings on the memory module as required. In some embodiments, the mobile memory module has a protective outer housing that is hardened to withstand catastrophic transfer switch failure while still retaining all operational settings stored on the module.

The above arrangement allows the mobile memory module to be quickly and easily removed from one controller and transferred to another controller for reuse purposes. All operational settings, calibrations, firmware version, events logs, and the like stored on the mobile memory module at the time of transfer are transported to the new controller. This makes it extremely convenient for technicians to install and configure a new controller, for example, after instances of transfer switch failure, controller failure, controller upgrade, backing up a controller, and the like. The mobile memory module also greatly simplifies technical field service support. Technicians can easily install and commission a new transfer switch or multiple new transfer switches of the same (or similar) types by removing a mobile memory module from a properly configured controller and installing the memory module on another controller that requires the same operational settings, calibrations, firmware version, event logs, and the like.

In general, in one aspect, embodiments of the present disclosure relate to a mobile memory module for an automatic transfer switch (ATS). The mobile memory module comprises, among other things, a memory board having a nonvolatile memory mounted, and a plurality of plug-in leads extending from a bottom of the memory board. The mobile memory module further comprises a protective outer housing enclosing the memory board and a plurality of pegs protruding from a bottom of the protective outer housing. Such a mobile memory module can then be removably mounted to a controller board in an ATS controller of the ATS.

In general, in another aspect, embodiments of the present disclosure relate to a method of commissioning an ATS for a power control system. The method comprises, among other things, connecting an ATS controller of the ATS to one or more switching components of the ATS, the ATS controller having a controller board therein that controls operation of the one or more switching components. The method also comprises removably mounting a mobile memory module to the controller board in data communication with the controller board, the mobile memory module storing one or more operational settings required for controlling the one or more switching components. The method further comprises releasably securing the mobile memory module to the controller board using a removable fastener, transferring the one or more operational settings from the mobile memory module to the controller board, and verifying proper operation of the controller board using the one or more operational settings transferred thereto.

In general, in yet another aspect, embodiments of the present disclosure relate to an ATS for a power control system. The ATS comprises, among other things, one or more electrical switching components and an ATS controller connect to the one or more switching components, the ATS controller having a controller board therein that controls operation of the one or more switching components. The ATS also comprises a mobile memory module removably mounted to the controller board and connected for data communication with the controller board, the mobile memory module configured to store one or more operational settings required for controlling the one or more switching components. The ATS further comprises a removable fastener releasably securing the mobile memory module to the controller board.

In accordance with any one or more of the foregoing embodiments, the mobile memory module comprises a plurality of pegs protruding from a bottom thereof, the plurality of pegs arranged to ensure foolproof mounting of the mobile memory module on the controller board.

In accordance with any one or more of the foregoing embodiments, the mobile memory module comprises a memory board having a nonvolatile memory mounted thereon, and the nonvolatile memory is preloaded with the one or more operational settings required for controlling the one or more switching components.

In accordance with any one or more of the foregoing embodiments, the mobile memory module further comprises a protective outer housing enclosing the memory board therein and, wherein the memory board has a plurality of plug-in leads extending therefrom that connect the nonvolatile memory for data communication with the controller board, the protective outer housing having a sufficient height to prevent the plug-in leads from protruding therefrom.

In accordance with any one or more of the foregoing embodiments, the protective outer housing has a generally planar handle or grip extending generally perpendicular from a top thereof, and the protective housing is made of a hardened material that is impact, shock, and heat resistant.

BRIEF DESCRIPTION OF THE DRAWINGS

A more detailed description of the disclosure, briefly summarized above, may be had by reference to various embodiments, some of which are illustrated in the appended drawings. While the appended drawings illustrate select embodiments of this disclosure, these drawings are not to be considered limiting of its scope, for the disclosure may admit to other equally effective embodiments.

FIGS. 3A-3D are schematic diagrams showing an exemplary housing for a mobile memory module according to embodiments of this disclosure;

Identical reference numerals have been used, where possible, to designate identical elements that are common to the figures. However, elements disclosed in one embodiment may be beneficially utilized on other embodiments without specific recitation.

DETAILED DESCRIPTION

This description and the accompanying drawings illustrate exemplary embodiments of the present disclosure and should not be taken as limiting, with the claims defining the scope of the present disclosure, including equivalents. Various mechanical, compositional, structural, electrical, and operational changes may be made without departing from the scope of this description and the claims, including equivalents. In some instances, well-known structures and techniques have not been shown or described in detail so as not to obscure the disclosure. Further, elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Figure 1:
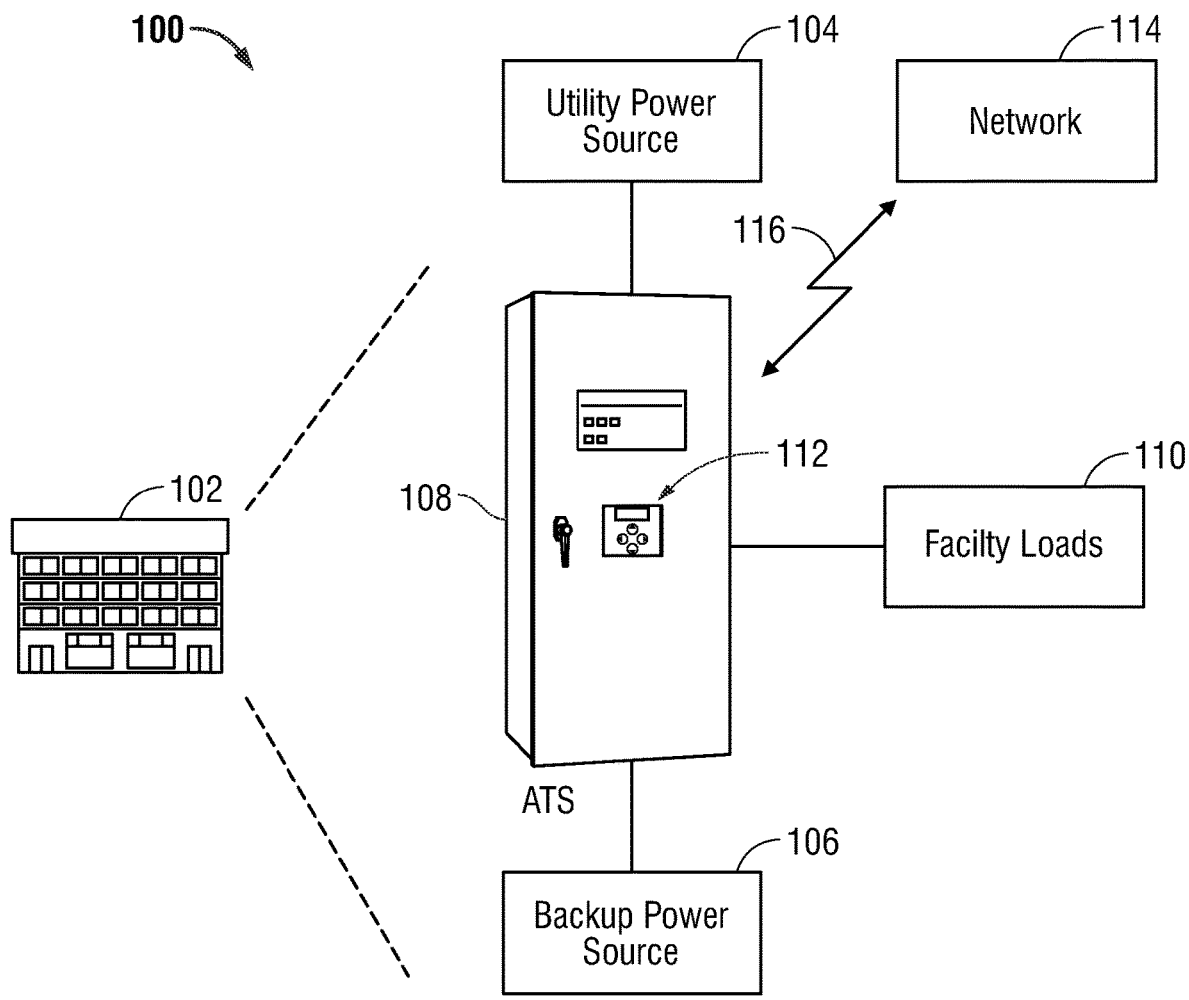
FIG. 1 is a schematic diagram showing an exemplary automatic transfer switch (ATS) having a mobile memory module according to embodiments of this disclosure.

Referring now to FIG. 1, a schematic diagram is shown for an exemplary power control system (PCS) 100 that provides electrical power to a facility 102. The facility 102 may be any facility that receives electrical power from a utility power source 104, typically a local power station. Examples include industrial facilities, such as chemical processing plants, manufacturing plants, and the like, as well as office buildings, sporting arenas, apartment complexes, certain residential homes, and the like. Backup power for the facility 102 is provided by one or more backup power sources 106, such as a backup power generator.

The PCS 100 includes an automatic transfer switch (ATS) 108 that connects the utility power source 104 for distribution of electrical power to various facility loads 110. The ATS 108 generally resembles any one of the several commercially available automatic transfer switches insofar as there is an exterior cabinet and door that house one or more switching components for connecting an electrical power source to power distribution equipment (e.g., electrical panels, circuit breakers, etc.). An example is the ASCO 7000 series of automatic transfer switches available from Schneider Electric of Boston, Massachusetts.

In general operation, the ATS 108 continuously monitors electrical power received from the utility power source 104 for compliance with certain voltage frequency, and phase angle requirements consistent with normal utility power. When the ATS 108 detects that the received power has deviated from normal utility power, such as when a power outage occurs, the unit automatically switches the facility 102 to the backup power source 106. Likewise, when the ATS 108 detects that normal utility power has been restored, it automatically switches the facility 102 back to the utility power source 104.

The power monitoring and switching functions of the ATS 108 is controlled by an ATS controller, generally indicated at 112. The ATS controller 112, like the ATS 108, generally resembles any one of the several commercially available ATS controllers insofar as there is a user interface with display and keys (which may be tactile or touch screen keys) that a user can use to interact with the controller 112. An example is the ASCO Group 5 Controller available from Schneider Electric. The user may then configure the ATS controller 112 with various operational settings and other information required to control operation of the ATS 108.

The operational settings for the ATS controller 112 are typically customized for the requirements of the PCS 100 in which the ATS 108 is installed. Examples include voltage and frequency settings (e.g., normal and emergency voltage and frequency pickup and dropout); time delay settings (e.g., bypass running time delay, standard time delays); features settings (e.g., commit on transfer, shed load, phase rotation, in-phase monitor settings); general settings (e.g., reset settings, language, communication, logging, password); and engine exerciser settings (e.g., date and time, exercise programs and parameters). In addition to operational settings, the ATS controller 112 may also be configured with calibration history, firmware version, event logs, and other information relevant to operation of the ATS 108.

Figure 2:
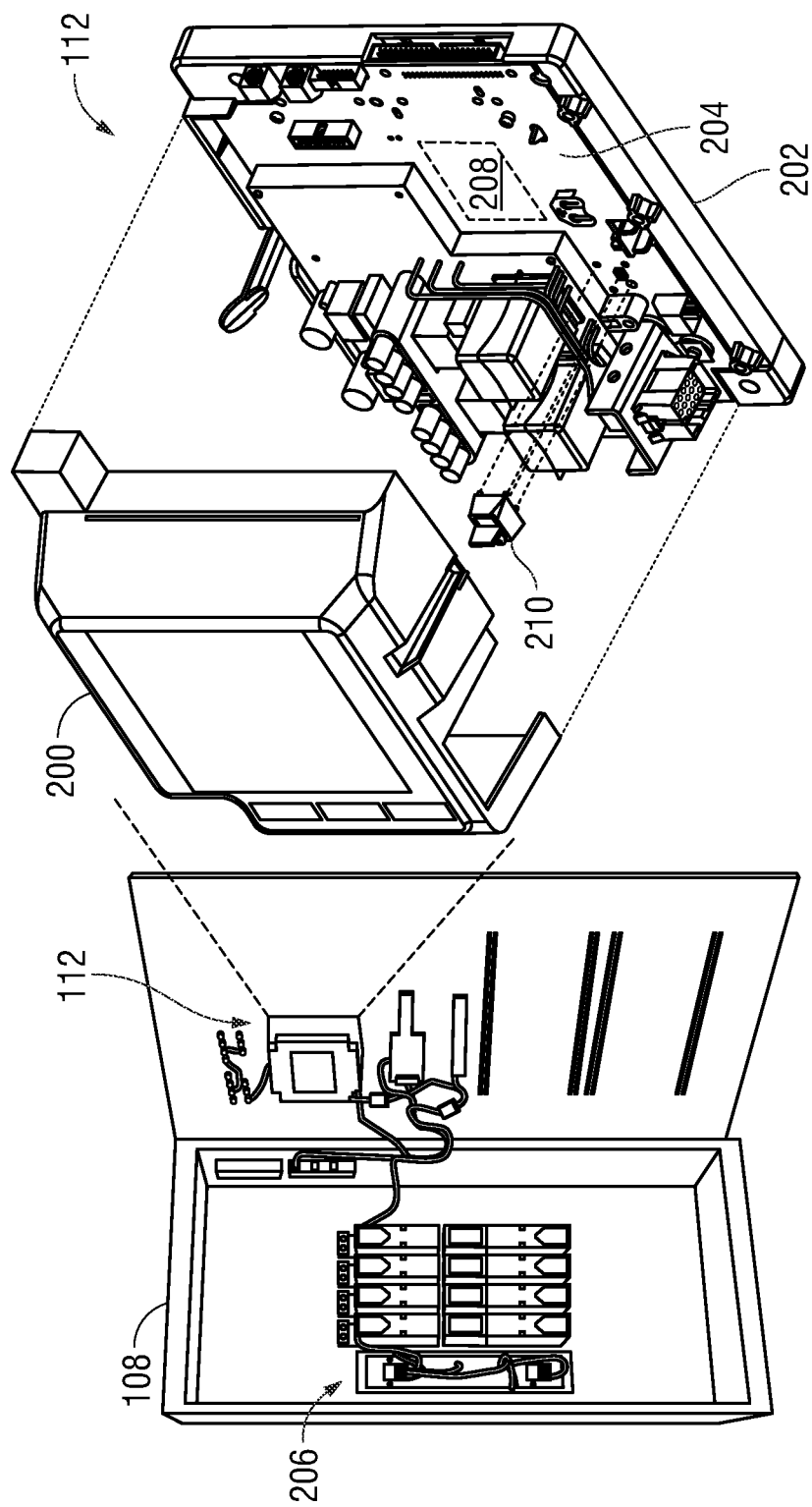
FIG. 2 is schematic diagram showing an exemplary ATS controller board having a mobile memory module according to embodiments of this disclosure.

In accordance with embodiments of the present disclosure, the ATS controller 112 is equipped with a mobile memory module that stores one or more, and preferably all, of the operational settings required by the controller to operate, as shown in FIG. 2. In addition, in some embodiments, the ATS controller 112 may be connected to a network 114, which may be an intra-company network (e.g., private enterprise Cloud) or a generally available network (e.g., third-party Cloud). The ATS controller 112 may be connected to the network 114 via a wired or wireless network connection 116 (e.g., Ethernet, Bluetooth, Wi-Fi, cellular, satellite, etc.). In these embodiments, the one or more operational settings may be stored in a repository on the network 116 and downloaded to and stored on the ATS controller 112 as needed (e.g., on the mobile memory module).

FIG. 2 is a schematic diagram illustrating a perspective view of the ATS controller 112 in a partially disassembled state. As this view shows, the ATS controller 112 has a top cover 200 that can be latched to a bottom cover 202 on which an ATS controller board 204 is attached. The entire unit is then secured to the inside of the ATS 108 and connected to one or more switching components 206 therein for controlling operation thereof. The ATS controller board 204 has various discrete and integrated circuit components mounted thereon, including a microprocessor 208 programmed to execute instructions that control operation of the ATS 108. The microprocessor 208 in this example is mounted on the underside of the controller board 204 (dashed lines).

A mobile memory module 210 is removably mounted on the top side of the controller board 204 in data communication with the microprocessor 208. As mentioned, the mobile memory module 210 is a discrete, nonvolatile memory module that stores various operational settings and other information required by the microprocessor 208 to control operation of the ATS 108. The microprocessor 208 can retrieve these operational settings and other information from the mobile memory module 210 as needed and also store updated or new operational settings on the mobile memory module 210 as required.

The removability of the mobile memory module 210 allows easy transfer and reuse of the operational settings and other information on one ATS controller 112 at another ATS controller 112. All operational settings, calibrations, firmware version, events logs, and other information stored on the mobile memory module 210 at the time of removal can be transported to the new ATS controller 112 with minimal effort. This makes it extremely convenient for technicians to install and configure a new ATS controller 112 in the event of transfer switch failure, controller malfunction, controller upgrade, backing up a controller, and the like.

The mobile memory module 210 also simplifies technical field service support. Technicians can easily install and commission a new ATS 108 or multiple new transfer switches of the same (or similar) types by removing a mobile memory module 210 from a properly configured ATS controller 112 and installing the memory module 210 on another ATS controller 112 that requires the same operational settings, calibrations, firmware version, event logs, and the like. The technician can also copy the operational settings and other information stored on the mobile memory module 210 to another mobile memory module 210.

FIGS. 3A-3D are schematic diagrams illustrating front, side, top, and bottom views, respectively, of an exemplary protective outer housing 300 for the mobile memory module 210 according to some embodiments. As these views show, the housing 300 has a generally rectangular or block shape with four side walls, each of which is labeled 302, and a top wall 304 that together with the side walls 302 define a hollow interior. The corners between adjacent side walls 302 may be beveled and taper from the top toward the bottom of the side walls 302 in some embodiments, but this feature is optional for aesthetic purposes. As another optional feature, the housing 300 may include a generally planar grip or handle 306 extending generally perpendicular from the top wall 304 that a user can easily pinch or grab between thumb and forefinger to facilitate installing and removing the mobile memory module 210 from the ATS controller board 204.

Mounting pegs 308a-c protrude from the bottom of the housing 300 at the corners thereof to facilitate physically mounting the mobile memory module 210 on the ATS controller board 204. The mounting pegs 308a-c may be formed as an integral part of the housing 300 via a molding or similar process, or each mounting peg 308a-c may be attached to the housing 300 via a suitable chemical or mechanical attachment means (e.g., adhesives, snapped into place, etc.). Note that are three mounting pegs 308a-c in the example shown, each having equal length and width, to ensure proper orientation of the mobile memory module 210 on the ATS controller board 204. Alternative poka-yoke mounting mechanisms may of course be used, such as two adjacent mounting pegs or pegs with different cross-sections and/or widths (with corresponding mounting apertures on the ATS controller board 204).

Figure 5A:
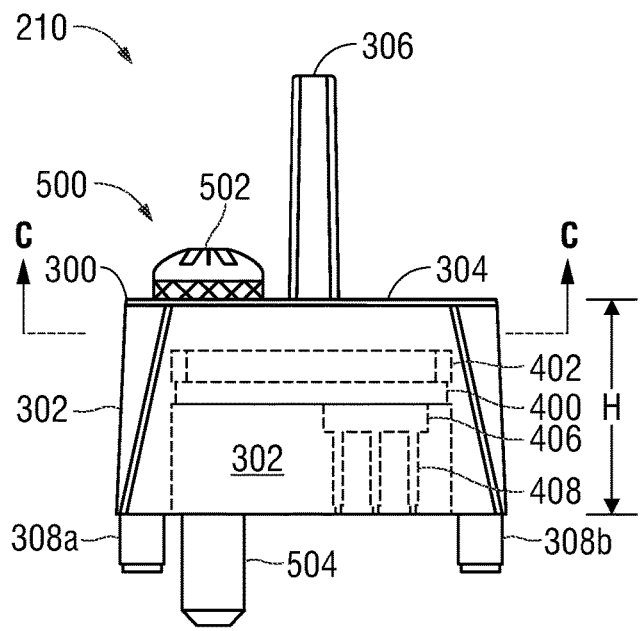
FIGS. 5A-5C are schematic diagrams showing the housing and memory board for a mobile memory module according to embodiments of this disclosure.
Figure 5B:
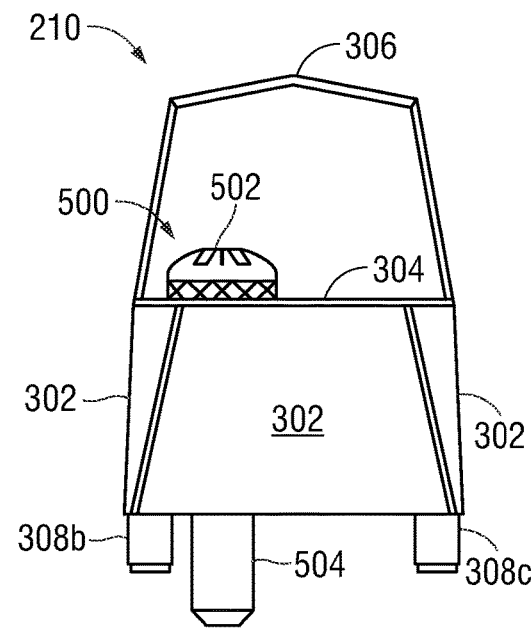
Figure 5C:
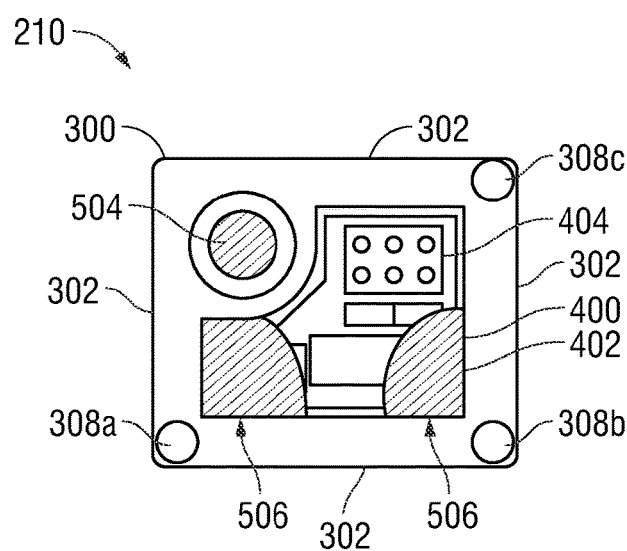

An opening 310, which may be threaded, is provided in the top wall 304 of the housing 300 for receiving a removable fastener, such as a locking pin, screw, and the like (see FIGS. 5A-5C). The removable fastener allows the mobile memory module 210 to be releasably secured to the ATS controller board 204 and facilitates removal of the module 210 as needed. A retention ring 312 may be provided in some embodiments to help keep the removable fastener from falling out of the housing 300 during the mounting or removal process. The dimensions of the housing 300 may be selected as needed for a particular application, but preferably the housing 300 is less than an inch in both height and width due to tight space constraints on the ATS controller board 204.

In some embodiments, the housing 300 may be hardened to withstand impact, shock, extreme heat, and the like due to catastrophic ATS failure or controller board malfunction. For example, a power surge may cause certain components on the ATS controller board to catch on fire. As another example, inclement weather, earthquakes, and the like, may cause random objects or tree branches to crash into the ATS. As such, the housing 300 may be made of an impact, shock, and/or fire resistant material, such as steel. Alternatively, where such precautions are not needed or too costly, the housing 300 may be made of a lighter material, such as aluminum or plastic.

Figure 4A:
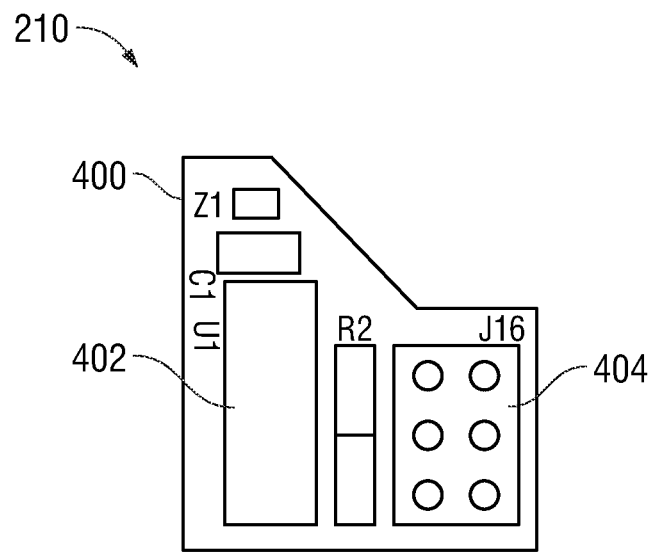
FIGS. 4A-4B are schematic diagrams showing an exemplary memory board for a mobile memory module according to embodiments of this disclosure.
Figure 4B:
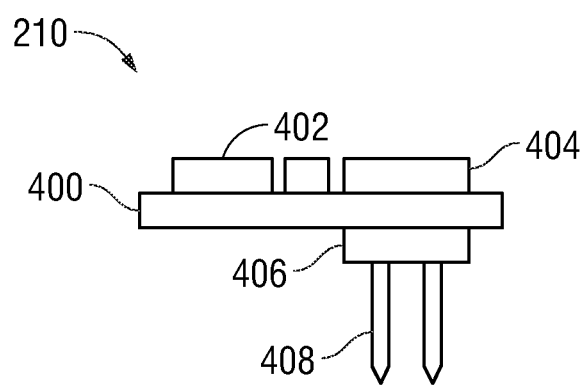

FIGS. 4A-4B are schematic diagrams illustrating top and side views, respectively, of an exemplary memory board 400 for the mobile memory module 210 according to some embodiments. As shown here, the memory board 400 is a printed circuit board that has several components mounted thereon, including a nonvolatile memory chip 402 and a jumper header 404. A leads header 406 having a plurality of plug-in leads 408 extending therefrom may be mounted on the underside of the memory board 400. The plug-in leads 408 electrically connect the nonvolatile memory chip 402 for data communication with the ATS controller board 204 (and the microprocessor 208 thereon) via appropriate selection of jumpers on the jumper header 404.

The nonvolatile memory chip 402 may contain any type of nonvolatile memory, such as flash memory, that has sufficient data storage capacity for the purposes herein. Examples of a suitable nonvolatile memory chips include the $I^2C$-Compatible (Two-Wire) Serial EEPROM 1-Mbit memory chip, part number AT24CM01, available from Microchip Technology Inc., of Chandler, Arizona. Similarly, the jumper header 404 and leads header 406 may be any suitable commercially available component designed for the purpose, including part number 951206-8622-AR, available from the Electronic Materials Solutions Division of the 3M Company in Austin, Texas.

The memory board 400 itself may be a conventional 2-layer printed circuit board with electrically conductive traces running between the layers to provide a signal path for the various components thereon. The dimensions of the memory board 400 may be selected as needed for a particular application, and are preferably small, about 0.5 inches or less in both length and width, due to space limitations.

FIGS. 5A-5B are schematic diagrams illustrating front and side views, respectively, of the housing 300 with the memory board 400 enclosed therein, while FIG. 5C illustrates a cutaway top view of FIG. 5A along lines C-C. As these views show, a removable fastener 500, such as a locking pin, screw, and the like, may be used to releasably secure the mobile memory module 210 to the ATS controller board 204 and facilitate removal of the module 210 as needed. The fastener 500 is inserted through the hole 310 in the top wall 304 of the housing 300 (FIGS. 3C-3D) preferably until the fastener head 502 is flushed against the top wall 304. The fastener body 504 meanwhile protrudes from the bottom of the housing 300 into the ATS controller board 204 to secure the housing 300 to the controller board 204.

One or more globs of epoxy or a similar substance, generally indicated at 506 (FIG. 5C), may be deposited on top of the memory board 400 to securely attach the memory board 400 to the housing 300, specifically to the underside of the top wall 304. Note in the above embodiments that the housing 300 has a height "H" that is sufficiently tall to ensure the plug-in leads 408 from the leads header 406 do not protrude from the bottom of the housing 300. This prevents the leads 408 from inadvertently contacting the ATS controller board 204 during mounting and removal of the mobile memory module 210.

Figure 6:
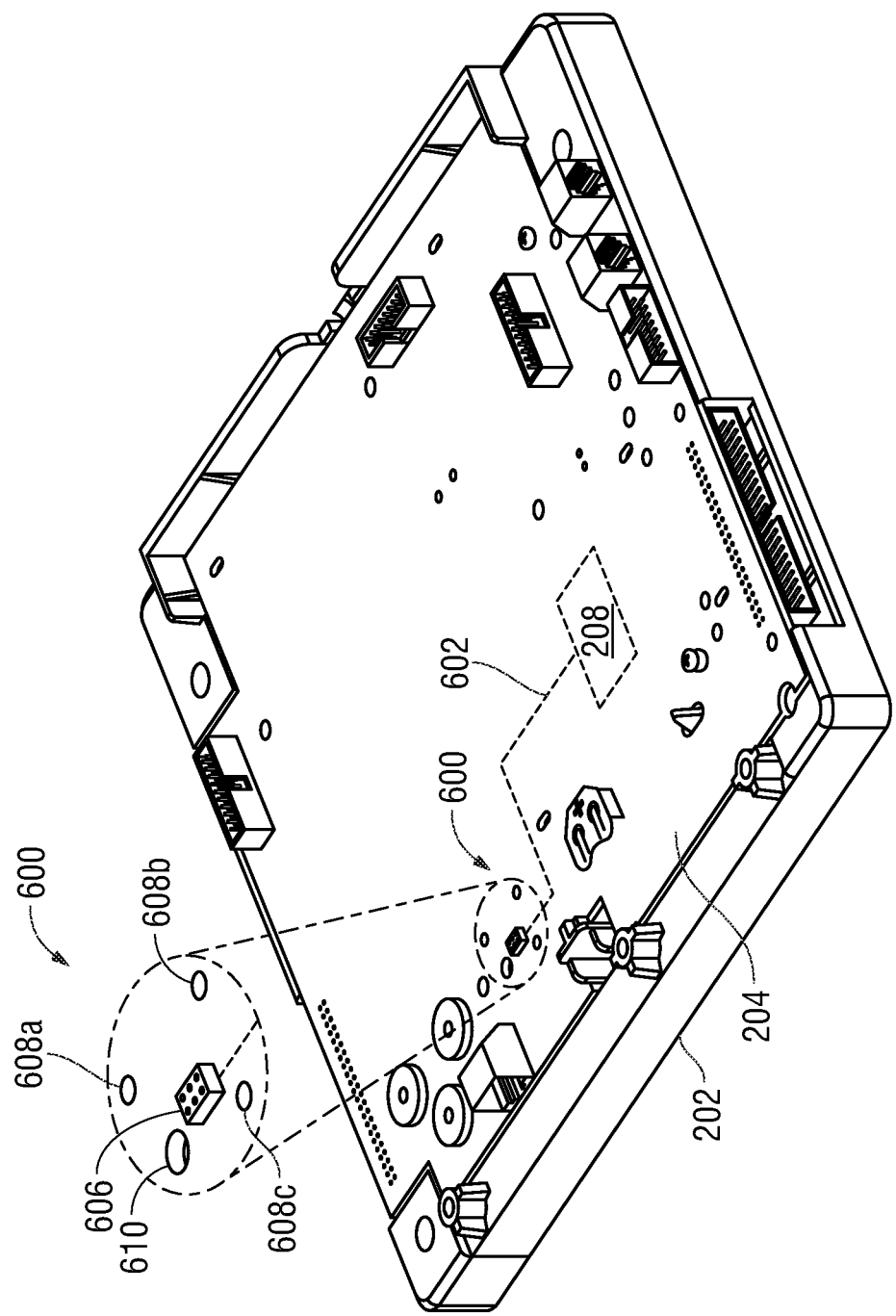
FIG. 6 is a schematic diagram showing mounting holes on an ATS controller board for a mobile memory module according to embodiments of this disclosure.

FIG. 6 is a schematic diagram illustrating a top perspective view of the ATS controller board 204 on which the mobile memory module 210 may be mounted in some embodiments. As this view shows, the ATS controller board 204 has a set of mounting holes, indicated at 600, for mounting the mobile memory module 210 on the controller board. Once mounted, the mobile memory module 210 (and the nonvolatile memory chip 402 thereon) is connected for data communication with the microprocessor 208 via one or more electrically conductive traces, generally indicated by line 602, that provide a signal path between the mobile memory module 210 and the microprocessor 208.

In the FIG. 6 example, the set of mounting holes 600 includes mounting holes 608a-c that correspond in size, shape, and relative position to the mounting pegs 308a-c (FIGS. 3A-3D) discussed above. As noted, however, alternative hole sizes, shapes, number, and arrangements may be used to ensure foolproof mounting of the mobile memory module 210 in the proper orientation. Also provided on the ATS controller board 204 is a hole 610 (which may be threaded) for receiving the fastener 500 (FIGS. 5A-5C) to secure the mobile memory module 210 to the controller board 204. A socket header 606 is mounted on the ATS controller board 204 for receiving the plug-in leads 408 from the leads header 406 (FIGS. 4A-4B) to electrically connect the mobile memory module 210 to the signal path 602 in the controller board 204.

Figure 7:
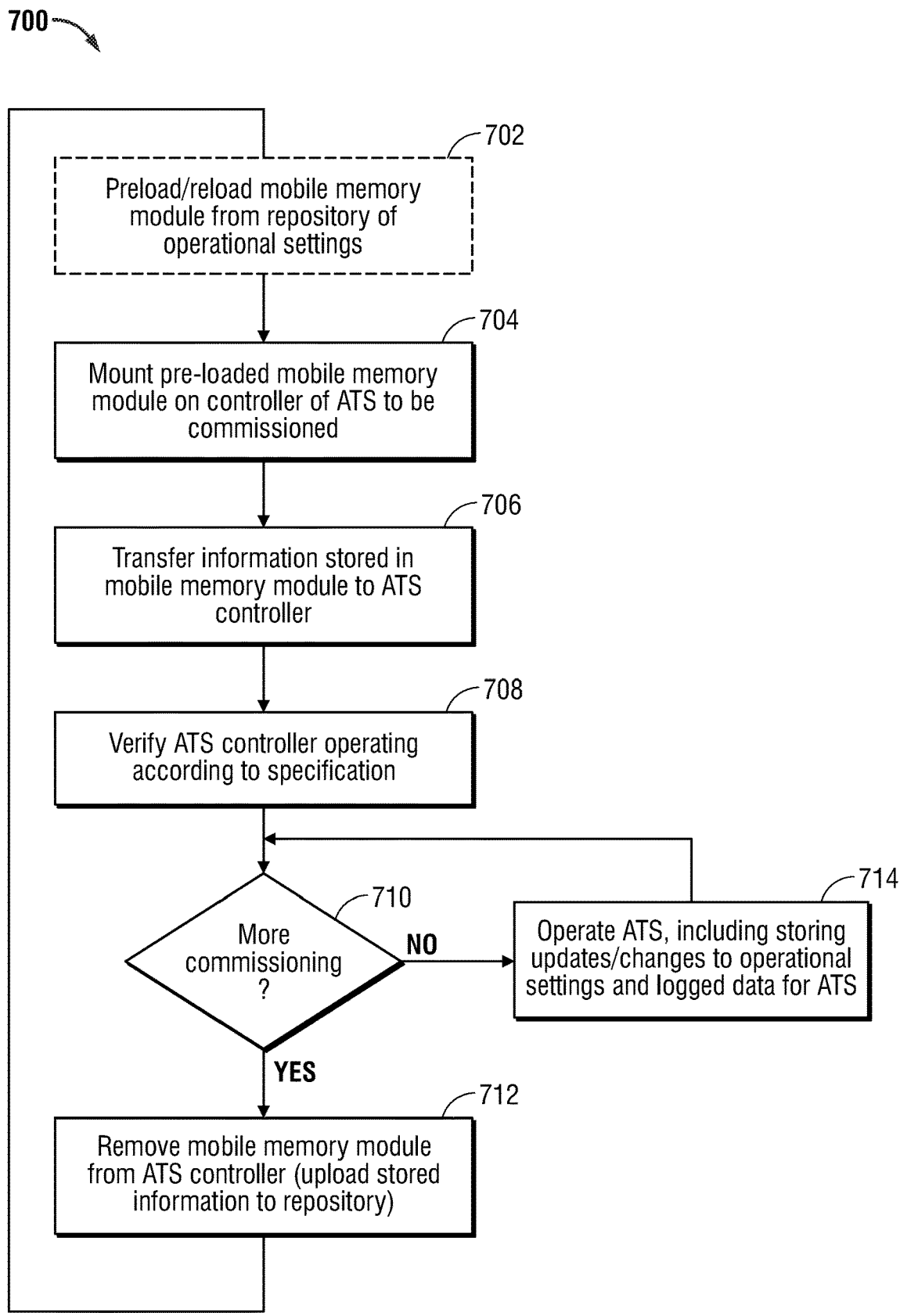
FIG. 7 is a flow diagram showing a method of commissioning an ATS using a mobile memory module according to embodiments of this disclosure.

Thus far, a number of specific embodiments of the mobile memory module have been described. Following now in FIG. 7 is a general method that may be used by or with the mobile memory module according to embodiments of the present disclosure FIG. 7 is a flow diagram illustrating a method 700 of commissioning an ATS for a power control system using a mobile memory module according to embodiments of this disclosure. Commissioning refers to process of verifying that the ATS is properly installed and operating according to specifications. The commissioning process typically includes configuring the ATS with specific operational settings that control how the ATS monitors and responds when a power outage is detected. The operational settings are usually customized for the particular power control system in which the ATS is installed and may vary from installation to installation.

The method 700 generally begins after an ATS has already been physically installed and all required mechanical and electrical connections have been made. At 702, as an optional step, a mobile memory module is preloaded or reloaded with various operational settings and other information required to control operation of the ATS. This step is particularly useful for instances where the commissioning process is being performed on a replacement ATS controller and the required information was previously stored in a repository of such information (e.g., on a private or public Cloud).

At 704, the mobile memory module is mounted in the controller of the ATS to be commissioned. The mobile memory module may be a new module, or it may be one that has already been previously loaded with the proper operational settings and other information for the ATS to be commissioned. For example, the ATS and/or controller may be a replacement ATS and/or controller and the mobile memory module is one that was pulled from the original ATS and/or controller. Alternatively, the operational settings and other information may be downloaded to the mobile memory module from another mobile memory module that was pulled from the original ATS and/or controller, or from a repository of such information as discussed above.

At 706, the operational settings and other information stored in the mobile memory module are transferred or otherwise imported to the ATS controller. This may be accomplished via any suitable data transfer process that can read the operational settings and other information stored on the mobile memory module and copy such data to the ATS controller. Once the transfer is completed, then the ATS controller is tested at 708 using the transferred operational settings to confirm the controller is operating according to specification.

At 710, a determination is made whether additional commissioning is needed. If the determination is yes, then at 712, the mobile memory module is removed from the ATS controller and a blank mobile memory module is substituted in place. The operational settings and other information in the ATS controller is then exported or otherwise transferred to the substitute mobile memory module using the data transfer process referenced above. The method then returns to 704 and the process is repeated for the ATS to be commissioned using the removed mobile memory module.

If the determination at 710 is no, then the ATS operates as normal at 714 until such time when additional commissioning is needed. This includes the ATS storing in the mobile memory module any updates or changes to the operational settings, as well as any other information or data that is typically logged during normal operation of the ATS. If the determination at 710 is yes, then the mobile memory module is removed from the ATS controller at 712 and the method returns to 702 to repeat the process. As an optional step, the information stored on the mobile memory module can be transferred or otherwise uploaded to the repository for subsequent reuse before or after the mobile memory module is removed from the ATS.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The various embodiments disclosed herein may be implemented as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer-readable medium(s) having computer-readable program code embodied thereon.

Any combination of one or more computer-readable medium(s) may be utilized. The computer-readable medium may be a non-transitory computer-readable medium. A non-transitory computer-readable medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer-readable medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions may be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

The flowchart and block diagrams in the figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein, but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

We claim:

1. An automatic transfer switch (ATS) for a power control system, comprising:
    one or more electrical switching components;
    an ATS controller connect to the one or more switching components, the ATS controller having a controller board therein that controls operation of the one or more switching components;

a mobile memory module removably mounted to the controller board and connected for data communication with the controller board, the mobile memory module configured to store one or more operational settings required for controlling the one or more switching components; and a removable fastener releasably securing the mobile memory module to the controller board.

2. The automatic transfer switch of claim 1, wherein the mobile memory module comprises a plurality of pegs protruding from a bottom thereof, the plurality of pegs arranged to ensure foolproof mounting of the mobile memory module on the controller board.

3. The automatic transfer switch of claim 1, wherein the mobile memory module comprises a memory board having a nonvolatile memory mounted thereon.

4. The automatic transfer switch of claim 3, wherein the nonvolatile memory is preloaded with the one or more operational settings required for controlling the one or more switching components.

5. The automatic transfer switch of claim 3, wherein the mobile memory module further comprises a protective outer housing enclosing the memory board therein and, wherein the memory board has a plurality of plug-in leads extending therefrom that connect the nonvolatile memory for data communication with the controller board, the protective outer housing having a sufficient height to prevent the plug-in leads from protruding therefrom.

6. The automatic transfer switch of claim 5, wherein the protective outer housing has a generally planar handle or grip extending generally perpendicular from a top thereof.

7. The automatic transfer switch of claim 5, wherein the protective housing is made of a hardened material that is impact, shock, and heat resistant.

8. A mobile memory module for an automatic transfer switch (ATS), comprising:

a memory board having a nonvolatile memory mounted thereon;

a plurality of plug-in leads extending from a bottom of the memory board;

a protective outer housing enclosing the memory board therein; and a plurality of pegs protruding from a bottom of the protective outer housing;

wherein the mobile memory module is configured to be removably mounted to a controller board in an ATS controller of the ATS.

9. The mobile memory module of claim 8, wherein the plurality of pegs are arranged to ensure foolproof mounting of the mobile memory module on the controller board.

10. The mobile memory module of claim 8, wherein the protective outer housing has a sufficient height to prevent the plug-in leads from protruding therefrom.

11. The mobile memory module of claim 8, wherein the protective outer housing has a generally planar handle or grip extending generally perpendicular from a top thereof.

12. The mobile memory module of claim 8, wherein the protective housing is made of a hardened material that is impact, shock, and heat resistant.

* * * * *